United States Patent
Anderson (10) Patent No.: US 7,415,083 B2
(45) Date of Patent: Aug. 19, 2008

(54) AGC SCHEME AND RECEIVER FOR USE IN A WIRELESS COMMUNICATION SYSTEM

(75) Inventor: Nicholas Anderson, Bath (GB)

(73) Assignee: IpWireless, Inc., San Bruno, CA (US)

( * ) Notice: Subject to any disclaimer, the term of this patent is extended or adjusted under 35 U.S.C. 154(b) by 609 days.

(21) Appl. No.: 10/207,634

(22) Filed: Jul. 29, 2002

(65) Prior Publication Data

US 2003/0091132 A1 May 15, 2003

(30) Foreign Application Priority Data

Aug. 1, 2001 (GB) .................... 0118754.1

(51) Int. Cl.
   *H04L 27/08* (2006.01)
(52) U.S. Cl. .................... 375/345
(58) Field of Classification Search ........... 375/146, 375/147, 345, 355–367; 370/333, 335, 503
   See application file for complete search history.

(56) References Cited

U.S. PATENT DOCUMENTS

| | | | |
|---|---|---|---|
| 3,918,003 | A | 11/1975 | Seidel |
| 4,567,485 | A | 1/1986 | Oshima et al. |
| 5,764,689 | A * | 6/1998 | Walley ............ 375/147 |
| 6,246,673 | B1 * | 6/2001 | Tiedemann et al. ...... 370/333 |
| 6,510,188 | B1 * | 1/2003 | Isaksen et al. .......... 375/345 |
| 6,636,496 | B1 * | 10/2003 | Cho et al. .............. 370/335 |
| 2002/0006122 | A1 * | 1/2002 | Zeira .................... 370/335 |
| 2002/0146039 | A1 * | 10/2002 | Demir et al. ............ 370/503 |
| 2002/0186752 | A1 * | 12/2002 | Proctor et al. .......... 375/146 |

FOREIGN PATENT DOCUMENTS

| | | |
|---|---|---|
| EP | 0668664 | 1/1995 |
| EP | 0886388 A2 | 12/1998 |
| EP | 1102426 A2 | 5/2001 |
| GB | 2022947 | 6/1979 |

(Continued)

OTHER PUBLICATIONS

Search Report mailed Nov. 13, 2001 for GB Application No. GB0118754.1 filed Aug. 1, 2001, three pages.

(Continued)

*Primary Examiner*—Khai Tran
(74) *Attorney, Agent, or Firm*—Morrison & Foerster LLP (57) ABSTRACT

Automatic gain control (AGC) and synchronisation acquisition by a communication unit in a wireless communication system, e.g. a Universal Mobile Telecommunication System (UMTS) system, is described. AGC is performed using a downlink beacon function, for example a power level ($P_{beacon}$). Amplitude-equalising (limiting) is performed as part of synchronisation acquisition. Separate AGC processes are used for different stages of synchronisation acquisition. One AGC process uses a peak power ($P(k)$) of a received signal over a frame. Another AGC process uses a peak power ($P(k)$) of a received signal over only a portion of a frame, the portion comprising an initial synchronisation code. Another AGC process uses measurements of a received signal ($P_0(k)$) taken in a downlink beacon timeslot. These processes tend to provide tolerance to a varying number of codes (M) transmitted on a timeslot-by-timeslot basis and robust initial synchronisation in the presence of strong uplink interference.

16 Claims, 10 Drawing Sheets

FOREIGN PATENT DOCUMENTS

| | | |
|---|---|---|
| GB | 2121251 | 5/1983 |
| JP | 58027412 | 2/1983 |
| JP | 61154329 | 7/1986 |
| JP | 040170232 | 6/2004 |
| WO | WO-02/32018 A2 | 4/2002 |

OTHER PUBLICATIONS

Search Report mailed Sep. 20, 2004 for GB Application No. GB0118754.1 filed Aug. 1, 2001, four pages.

International Search Report mailed Mar. 27, 2003, for PCT Application No. PCT/GB02/03551 filed Jul. 31, 2002, 3 pages.

* cited by examiner

Prior Art

Figure 3

Prior Art

AGC SCHEME AND RECEIVER FOR USE IN A WIRELESS COMMUNICATION SYSTEM

FIELD OF THE INVENTION

Figure 1:
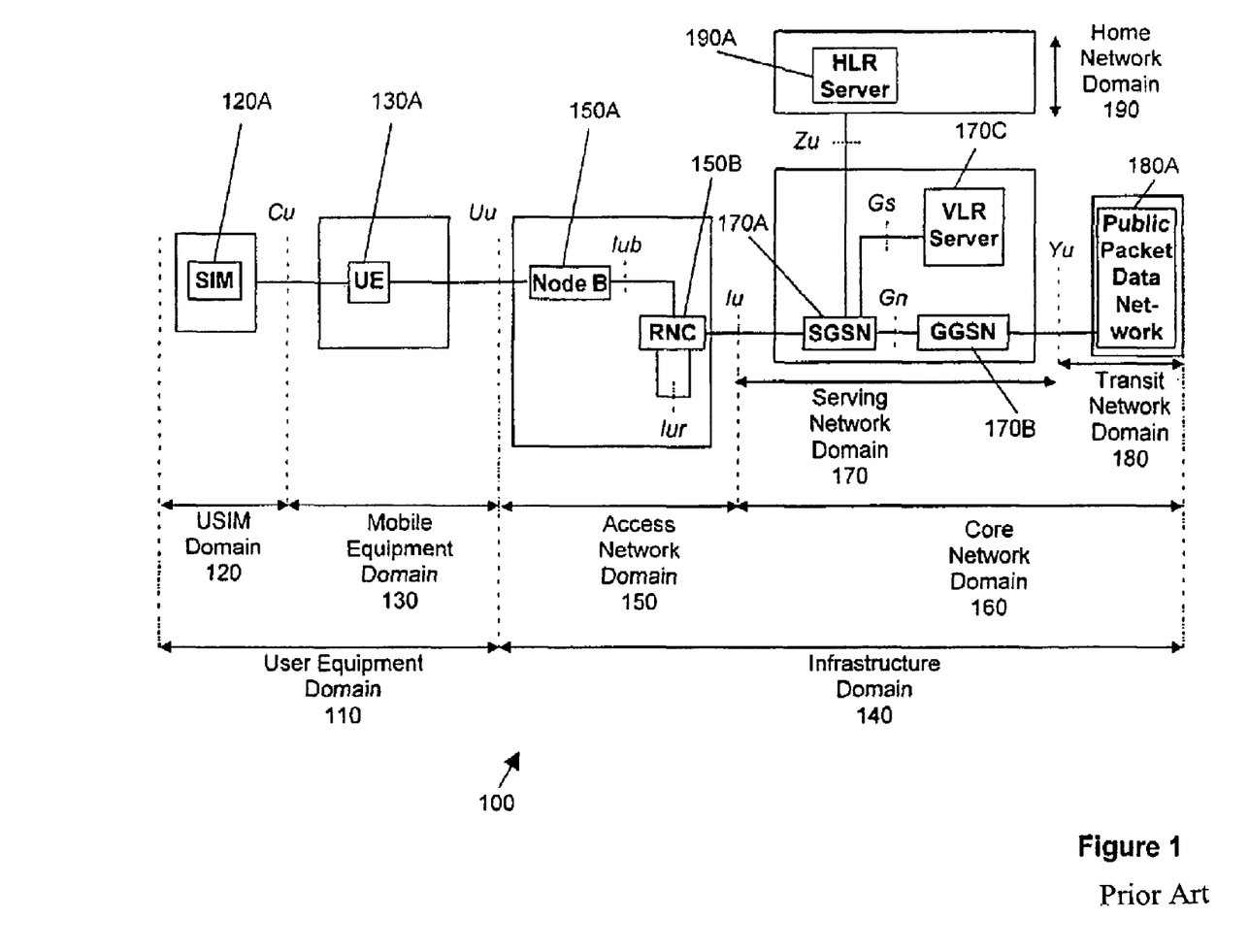
FIG. 1 shows a 3GPP system.

This invention relates to wireless communication systems and particularly to Packet-Based TDD-CDMA (Time Division Duplex-Code Division Multiple Access) systems such as UMTS (Universal Mobile Telecommunication System) systems complying with the evolving 3GPP ($3^{rd}$ Generation Partnership Project) standard. FIG. 1 shows a block diagram of a 3GPP wireless communication system.

BACKGROUND OF THE INVENTION

Figure 2:
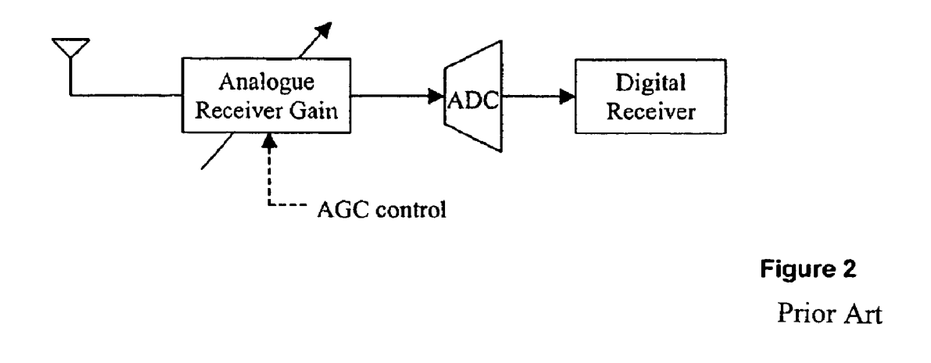
FIG. 2 shows an AGC operation.

In the field of this invention it is known, as shown in FIG. 2, that AGC (Automatic Gain Control) is a process used in a mobile radio receiver whereby the mobile adjusts the gain in the analogue sections of the receiver such that the signal is of the correct magnitude at the input to an ADC (Analogue to Digital Converter). If the signal is too large, then the signal will be limited or 'clipped', whereas if it is too small, it will be susceptible to significant signal-to-noise ratio degradation due to the quantisation process of the converter.

AGC must therefore adapt to the fluctuations in received power over time. Such fluctuations occur in mobile radio due to:
 the mean pathloss between transmitter and receiver,
 constructive and destructive interference between multiple transmission paths between transmitter and receiver (so-called fast-fading), and
 variations in the transmitted power of the wanted and interfering signals.

Figure 3:
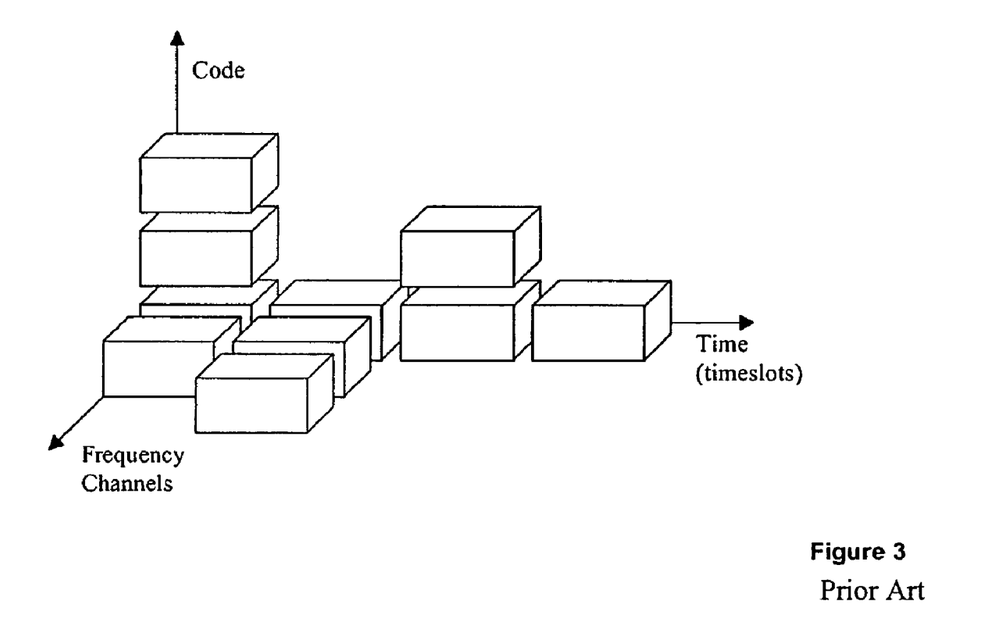
FIG. 3 shows resource allocation in Time/Frequency/Code in TDD-CDMA.

In a 3GPP TDD-CDMA radio communications system, the radio resource may be considered, as shown in FIG. 3, as divided into three orthogonal planes: namely those of frequency, time, and code. Each cell or cell-sector is assigned a specific frequency in which to operate. Within this frequency allocation, the resource is split into time frames, each of length 10 ms. Each time-frame is further sub-divided into 15 timeslots, each of length 666.67 μs. Each timeslot is divided in the code-domain into 16 channelisation or 'spreading' codes. The properties of these codes are arranged such as to enable extraction of the information transmitted over each code from the 'multi-code' composite signal by signal processing means. The system may therefore distribute select information towards targeted users by means of assigning them resource defined in the three co-ordinate resource-space of frequency, time and code.

Figure 4:
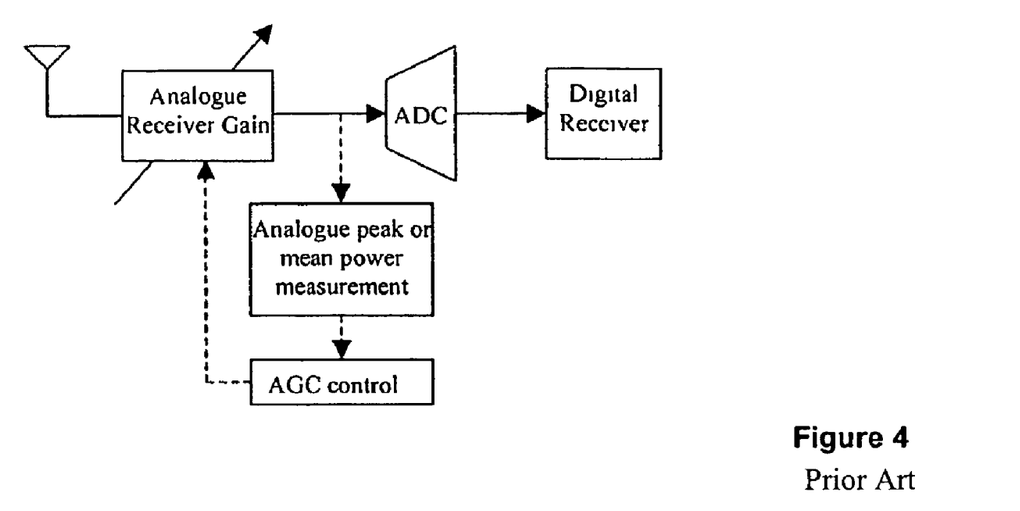
FIG. 4 shows AGC operation based on analogue-monitored signal.
Figure 5:
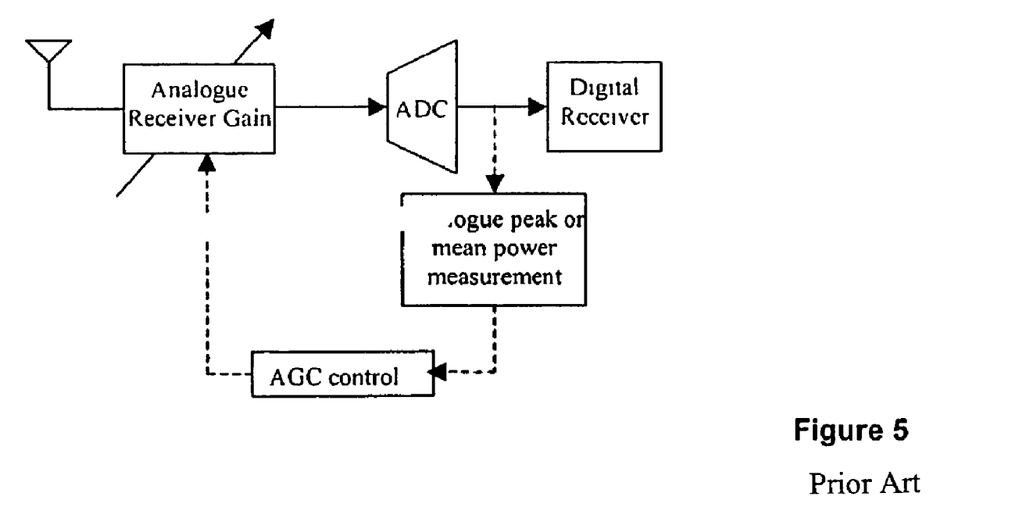
FIG. 5 shows AGC operation based on digital-monitored signal.

Many AGC loop designs exist (such as the analogue-monitored signal AGC loop shown in FIG. 4 and the digital-monitored loop shown in FIG. 5), but in general the loops are designed to monitor the received signal at the ADC input, or output, and provide negative feedback to the analogue variable receiver gain section in an attempt to maintain the monitored signal at a constant target level. In general, the measured characteristic of the monitored signal is peak-voltage, peak-power, or mean power. Thus, if the measured characteristic of the monitored signal is higher than the target, the analogue gain of the receiver is lowered, whereas if the characteristic of the monitored signal is lower than the target, the gain of the receiver is increased.

Figure 6:
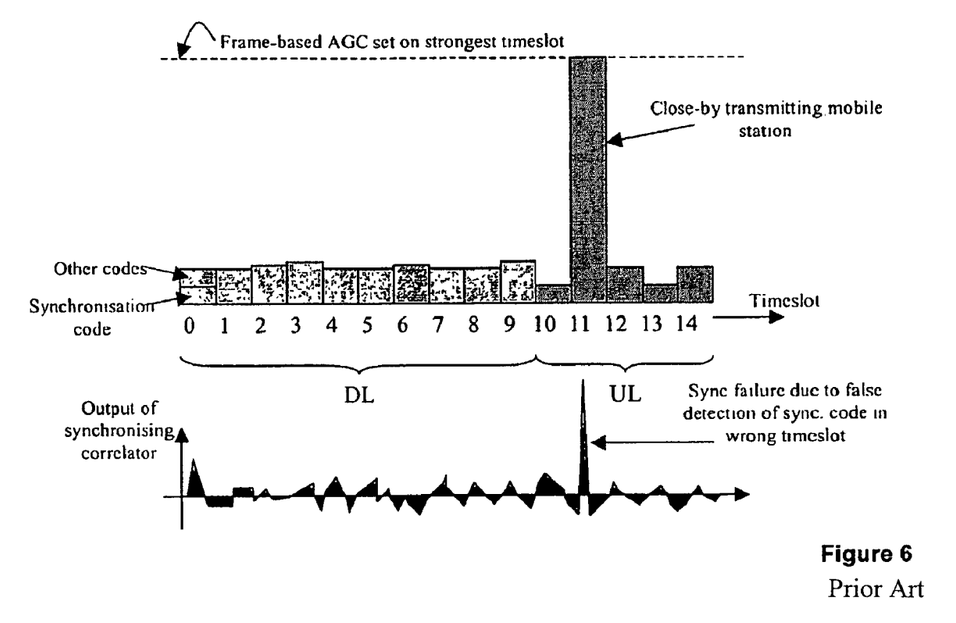
FIG. 6 shows AGC problem during initial synchronisation.

However, this known approach has the disadvantage(s) that:
1) In a packet-radio system such as a TDD-CDMA system, for a particular cell frequency, the power transmitted on a timeslot is, in general, a function of the number of codes transmitted. Thus, given the timeslot-segmented nature of the TDD-CDMA system, the power transmitted in each timeslot may vary considerably as the number of codes varies. The mobile-station, although aware of its own timeslot/code allocations, is not usually aware of allocations to other users and therefore cannot predict how much power will be received in a given timeslot. This therefore presents difficulties for AGC since it is the function of AGC to adjust the receiver analogue gain in response to the received power such that signal presented to the ADC is at an appropriate level.
2) For TDD-CDMA, a further problem exists for AGC due to the Time Division Duplex nature of the system. As illustrated in FIG. 6, during the initial synchronisation phase, the mobile station must search for a specific synchronisation code transmitted by the network. At this point, the mobile station does not have any knowledge of the frame timing of the system. Due to the fact that uplink timeslots are transmitted on the same frequency as downlink timeslots (but are separated in time within the frame), without knowledge of the frame timing, the mobile station must configure itself to receive on all timeslots in search of the synchronisation code. The mobile station receiver is therefore subject to reception of uplink signals from nearby mobile stations on the same cell frequency. These uplink signals may be hundreds of times larger in power than the downlink signal that the mobile is trying to detect. As a result, any AGC loop that tries to track the received signal power over the whole radio frame will try to accommodate the large uplink signal and may consequently suppress the (relatively small) wanted downlink synchronisation signal such as to render it undetectable (i.e., it is possible that the wanted signal in timeslot 0 will occupy so little of the ADC input voltage range as to render it undetectable).

Even if the signal is detectable, the synchronisation correlation peak in timeslot 0 may be much smaller than the correlation noise peak occurring in the timeslot with highest power. This will result in a synchronisation lock failure, or a false detection (which will also eventually lead to a synchronisation failure).

Although this problem will not always exist, it is desirable to implement a receiver strategy that provides robustness under these adverse conditions, since an intermittent inability to acquire synchronisation will obviously result in a high level of user dissatisfaction. Such conditions are likely to occur in any environment where there is a high possibility of users being in close proximity to each other.

A need therefore exists for an AGC scheme and limiting receiver architecture wherein the abovementioned disadvantage(s) may be alleviated.

STATEMENT OF INVENTION

In accordance with the present invention there is provided a method of performing automatic gain control in a communication system, comprising: using a power level of a signal received from the beacon function, and further comprising estimating a power level received from non-beacon function codes within a home cell of the communication system.

In accordance with a further aspect of the present invention there is provided a method of performing initial synchronisation in a communication unit of a communication system, comprising amplitude-equalising a received signal over a time frame.

In accordance with a further aspect of the present invention there is provided a method of performing an initial stage of a synchronisation acquisition process comprising an automatic gain control, AGC, process; the AGC process comprising use of a power characteristic of a received signal over a frame.

In accordance with a further aspect of the present invention there is provided a method of performing an intermediate stage of a synchronisation acquisition process comprising an automatic gain control, AGC, process; the AGC process comprising use of a power characteristic of a received signal over only a portion of a frame, the portion of a frame being a portion comprising an initial synchronisation code determined during a preceding initial stage of the synchronisation acquisition process.

In accordance with a further aspect of the present invention there is provided a method of performing a final stage of a synchronisation acquisition process comprising an automatic gain control, AGC, process; the AGC process comprising use of measurements of a received signal taken in a downlink beacon timeslot.

In accordance with a further aspect of the present invention there is provided a method of performing synchronisation acquisition in a communication unit of a communication system, the method comprising using different automatic gain control, AGC, processes for different stages of the synchronisation acquisition.

In accordance with a further aspect of the present invention there is provided an automatic gain control apparatus adapted to perform a method of automatic gain control in a communication system, comprising: using a power level of a signal received from the beacon function, and further comprising estimating a power level received from non-beacon function codes within a home cell of the communication system.

In accordance with a further aspect of the present invention there is provided a communication unit adapted to perform a method of automatic gain control in a communication system, comprising: using a power level of a signal received from the beacon function, and further comprising estimating a power level received from non-beacon function codes within a home cell of the communication system.

In accordance with a further aspect of the present invention there is provided a communication system adapted to perform a method of automatic gain control in a communication system, comprising: using a power level of a signal received from the beacon function, and further comprising estimating a power level received from non-beacon function codes within a home cell of the communication system.

In accordance with a further aspect of the present invention there is provided a Universal Mobile Telecommunication System adapted to perform a method of automatic gain control in a communication system, comprising: using a power level of a signal received from the beacon function, and further comprising estimating a power level received from non-beacon function codes within a home cell of the communication system.

Further aspects of the present invention are as claimed in the dependent claims.

BRIEF DESCRIPTION OF THE DRAWINGS

Embodiments of the present invention will now be described, by way of example only, with reference to the accompanying drawings, in which.

DESCRIPTION OF PREFERRED EMBODIMENTS

Referring firstly to FIG. 1, a typical, standard UMTS network (100) is conveniently considered as comprising: a user equipment domain (110), made up of a user SIM (USIM) domain (120) and a mobile equipment domain (130); and an infrastructure domain (140), made up of an access network domain (150), and a core network domain (160), which is in turn made up of a serving network domain (170) and a transit network domain (180) and a home network domain (190).

In the mobile equipment domain (130), user equipment UE (130A) receives data from a user SIM (120A) in the USIM domain 120 via the wired Cu interface. The UE (130A) communicates data with a Node B (150A) in the network access domain (150) via the wireless Uu interface. Within the network access domain(150), the Node B (150A) communicates with an RNC (150B) via the Iub interface. The RNC (150B) communicates with other RNC's (not shown) via the Iur interface. The RNC (150B) communicates with a SGSN (170A) in the serving network domain (170) via the Iu interface. Within the serving network domain (170), the SGSN (170A) communicates with a GGSN (170B) via the Gn interface, and the SGSN (170A) communicates with a VLR server (170C) via the Gs interface. The SGSN (170A) communicates with an HLR server (190A) in the home network domain (190) via the Zu interface. The GGSN (170B) communicates with public data network (180A) in the transit network domain (180) via the Yu interface.

Thus, the elements RNC (150B), SGSN (170A) and GGSN (170B) are conventionally provided as discrete and separate units (on their own respective software/hardware platforms) divided across the access network domain (150) and the serving network domain (170), as shown the FIG. 1.

The RNC (150B) is the UTRAN element responsible for the control and allocation of resources for numerous Node B's (150A); typically 50 to 100 Node B's may be controlled by one RNC. The RNC also provides reliable delivery of user traffic over the air interfaces. RNC's communicate with each other (via the interface Iur) to support handover and macrodiversity.

The SGSN (170A) is the UMTS Core Network element responsible for Session Control and interface to the Location Registers (HLR and VLR). The SGSN is a large centralised controller for many RNCs.

The GGSN (170B) is the UMTS Core Network element responsible for concentrating and tunnelling user data within the core packet network to the ultimate destination (e.g., internet service provider—ISP).

A first embodiment of the invention utilises the presence of the downlink beacon-function in TDD-CDMA. For every frame transmitted, in timeslot 0 the first code in the timeslot is always transmitted. Furthermore, it is always transmitted at a known reference power level. All codes in the downlink are transmitted at, or below, this reference power level. The central part within the timeslot of the beacon function transmission is comprised of a known sequence or 'midamble'. The midamble power is always the same as the reference power. Other codes transmitted on timeslot 0 must use midamble sequences other than the one used by the beacon function. Using, these facts, the receiver (i.e. receiving communication unit, e.g. a mobile station such as a mobile telephone) is able to estimate the power received from the beacon function ($P_{beacon}$) by measuring the power received in the known midamble sequence. By summing the powers received within the other midamble codes in timeslot 0, it is also able to estimate the total power received from non-beacon-function codes ($P_{non-beacon}$) within the home cell.

In addition to this the receiver is able to measure the total received power in the timeslot ($P_T$). This total power measurement will include power from the home cell, power received from other cells, as well as thermal noise in the receiver and other unwanted signals or 'blockers'. With knowledge of the maximum number of downlink codes that may be transmitted (M), the receiver can calculate the receive power that would be expected ($P_M$) in the current radio frame, if the home cell transmitted M codes all at reference power. This is achieved via the following equation:

$$P_M = P_T - P_{non-beacon} + (M-1)P_{beacon}$$

Figure 7:
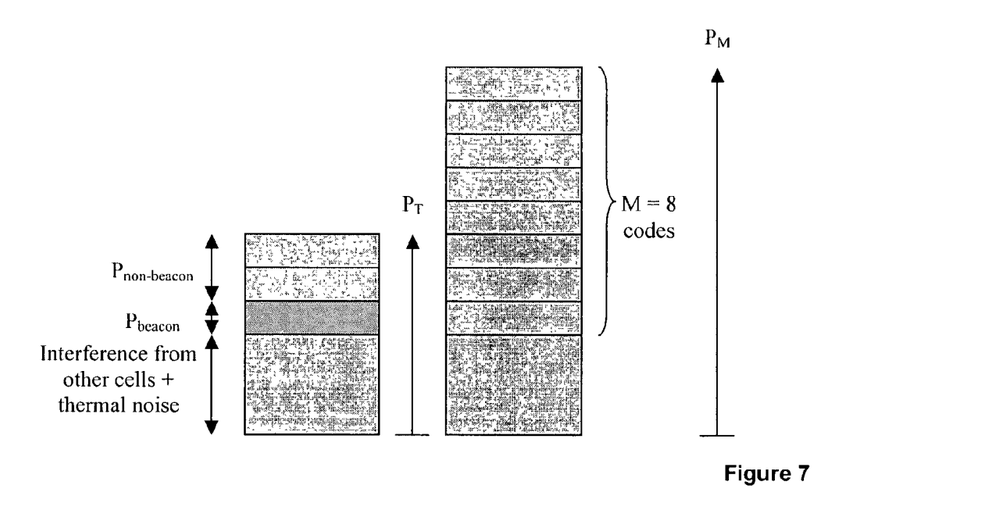
FIG. 7 shows principles of frame-based AGC operation.

FIG. 7 shows a diagrammatic representation of such frame-based AGC operation.

Thus, the AGC loop can be made to respond each frame to the characteristic $P_M$ and can attempt to maintain $P_M G$ at a desired target level T, where G is the variable receiver power gain. The target level is set such that when M codes are transmitted from the home cell (and a power of $P_M$ is received), the receiver power gain G is adjusted such that the signal at the input to the ADC is at the desired level T. The dynamic range of the ADC is sufficient to receive the composite signal when just one code is transmitted. In this case the signal at the input to the ADC will be smaller than T.

$$G = T/P_M$$

This invention provides a means of being able to track (by means of AGC) mean pathloss variations and variations in the mean interference power seen at a mobile receiver, whilst being capable of ignoring the power fluctuations observed as a result of the dynamic downlink allocations in the home cell of code/timeslot radio resource to users on the system.

A second set of embodiments, relating in particular to amplitude-equalisation (i.e. limiting), will now be described. As mentioned previously, prior to initial synchronisation in TDD-CDMA, any frame-based AGC approach may suffer from being driven not by the desired signal in timeslot 0, but by a much larger signal transmitted by a nearby mobile station in a timeslot designated for uplink use. The synchronisation process uses a correlator matched to the Primary Synchronisation Code (PSC) in order to find the position in the frame of the transmitted PSC. The code is of length 256 chips, and therefore has a processing gain of 24 dB. Thus, the correlator has the ability to suppress non-PSC signals by 24 dB, relative to signals containing the PSC. However, if a signal in another timeslot is more than 24 dB higher in power than the desired PSC signal, the correlator will be unable to find the PSC and a false detection, or no detection could occur. It is very possible that a nearby mobile station could generate such a signal at another's receiver.

However, it can be shown that most of the processing gain is still available, even when the amplitude information contained within the signal is removed. Thus, by amplitude-equalising the signal over the whole frame, the large signal can be made to have the same power as the small signal. However, due to information contained within the small signal (i.e., the PSC code), synchronisation can still be achieved. Such an amplitude-equalising receiver is termed a limiting receiver. If a limiting receiver architecture is used therefore, the PSC code can still be detected, even in the presence of a strong uplink signal from a nearby mobile station.

Once the position of the PSC code has been determined, the limiter can be turned-off and a linear receiver can be used throughout the rest of the call to demodulate data.

The limiting process may be performed either within the analogue part of the receiver, or may be performed digitally after the ADC's. If the signal arriving at the ADC's is too large to be accommodated by the ADC's, then a form of limiting will already have been achieved, since the signal at the ADC output will be a 'clipped' version of that at its input.

Figure 8:
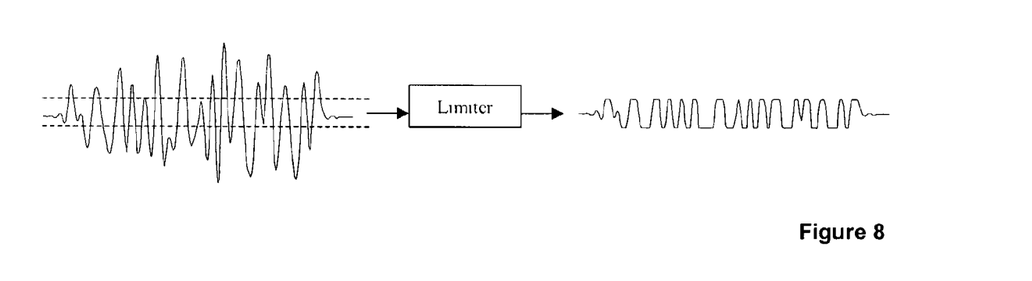
FIG. 8 shows action of a limiter.

FIG. 8 shows the action of a limiter.

For a quadrature baseband receiver in which two ADC's are used to capture the signal, this limiting process happens independently on both in-phase (I) and quadrature (Q) signal paths, thus introducing a little phase distortion and producing a non-ideal limiter (ideal limiters perfectly preserve the phase of the signal). However, even under these conditions, the PSC still remains detectable.

Figure 9:
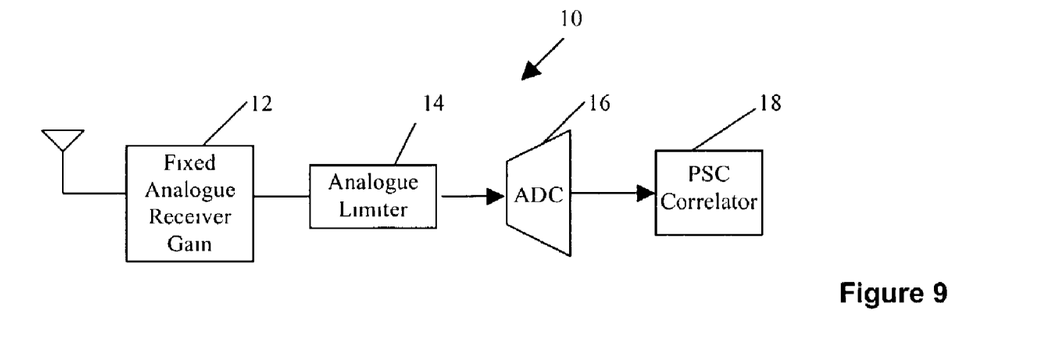
FIG. 9 shows an analogue-limiting PSC receiver.

One receiver architecture for synchronisation would therefore be to employ an analogue limiter before the ADC's. A fixed-gain receiver could then be used wherein the gain is configured such that the PSC signal could still be detected even when being received with a power lower than the receiver noise floor (i.e., the receiver gain is configured such that signals at thermal-noise level may be received). Such an analogue-limiting PSC receiver 10 is shown in FIG. 9, and comprises a fixed analogue receiver gain module 12, an analogue limiter 14, an ADC 16 and a PSC correlator 18.

Figure 10:
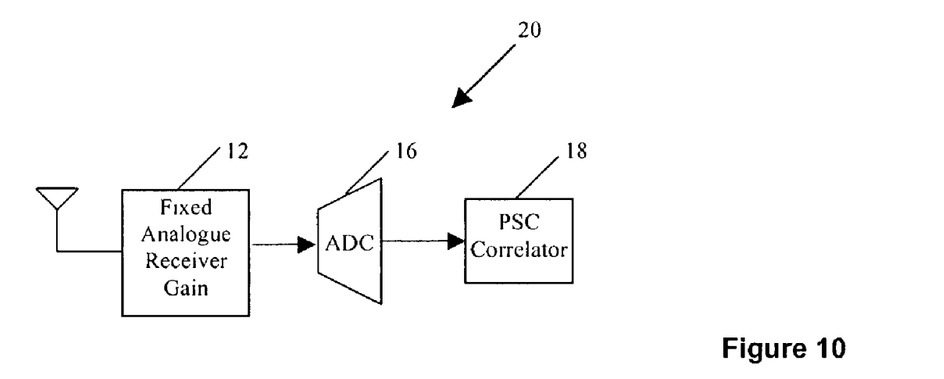
FIG. 10 shows an ADC-limiting PSC receiver.

Another receiver architecture could use the ADC's themselves as the limiting device, thereby removing the need for the analogue limiter. Such an analogue-limiting PSC receiver 20 is shown in FIG. 10, and comprises a fixed analogue receiver gain module 12, an ADC 16 and a PSC correlator 18.

A further receiver architecture could employ a digital limiter after the ADC's. In such a scheme, AGC could be used to attempt to maintain the signal across the frame within the ADC range, such that the 'ideal' digital limiter could be used to amplitude-equalise the received timeslots. However, the AGC scheme would have to incorporate mechanisms that would prevent a very large signal from suppressing the signal in timeslot 0 so far as to render it undetectable (i.e., the gain of the receiver would not be adjustable lower than a certain value).

Conversely, in the event that the mobile station is close to the base station transmitter, the received signal in timeslot 0 could be large and as such, due to the minimum-gain restriction, the wanted signal in timeslot 0 would clip at the ADC's. In this scenario, the ADC's would act as the limiter, even though a further digital limiter is employed. However, as previously mentioned, this does not produce any significant detection impairment.

Figure 11:
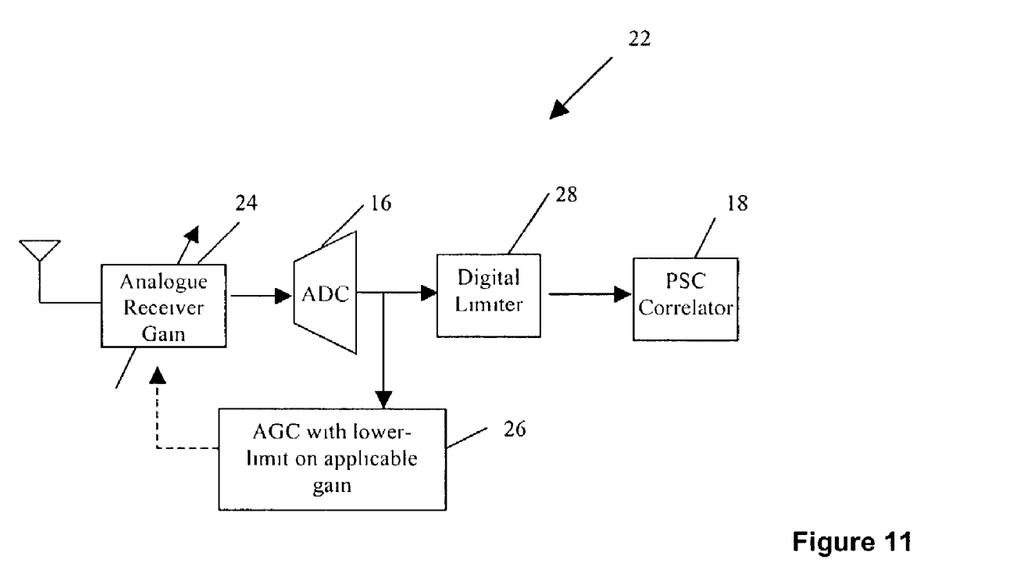
FIG. 11 shows a hybrid ADC/digitally-limiting PSC receiver.

Such a hybrid ADC/digitally-limiting PSC receiver 22 is shown in FIG. 11, and comprises an analogue receiver gain module 24, an ADC 16, an AGC module 26 providing AGC with a lower-limit on applicable gain, a digital limiter 28 and a PSC correlator 18.

In further embodiments, the use of the downlink beacon function, as described for example in the first embodiment above, may be combined with amplitude-equalising (limiting) arrangements including those described above in the second set of embodiments.

Further Embodiments

In a further aspect of the invention, separate AGC processes are used for different stages of synchronisation acquisition. One particular set of processes, for a particular set of stages of synchronisation acquisition, will now be described.

The earlier described arrangements and processes may be embodied as a TDD-CDMA receiver. In 3GPP TDD-CDMA the following processes are executed before a mobile station is synchronised to the network and is able to commence communication. They are executed in sequential order, as each process uses the successful completion of the previous process.

1. Primary Synchronisation Code Detection and Lock (PSC-lock)
2. Frequency Synchronisation with Node-B (Automatic Frequency Correction-AFC)
3. Secondary Synchronisation Code Demodulation (SSC) in order to determine start position of frame and timeslot 0 midamble group.
4. Midamble code detection within the midamble group.
5. Demodulation of BCCH logical channel (BCH transport channel, PCCPCH physical channel)

The AGC process running in the mobile station is adjusted depending on which stage the mobile station synchronisation process is at. Let us denote these as AGC processes 1, 2 and 3. Process 1 runs until step 1 has been completed, process 2 runs until step 4 has been completed, and process 3 runs from the start of step 5 onwards.

The following table illustrates these Mobile Station AGC Processes

| Step | Synchronisation Stage | AGC Process |
|---|---|---|
| 1 | PSC detection | 1 |
| 2 | AFC | 2 |
| 3 | SSC demodulation | 2 |
| 4 | Midamble code detection | 2 |
| 5 | Demodulation of BCCH | 3 |

Mobile Station Pre-Sync AGC Process 1

Pre-Sync AGC process 1 is run up until PSC synchronisation lock has been achieved. Prior to PSC synchronisation the receiver architecture can be approximated by that shown in FIG. 12.

Figure 12:
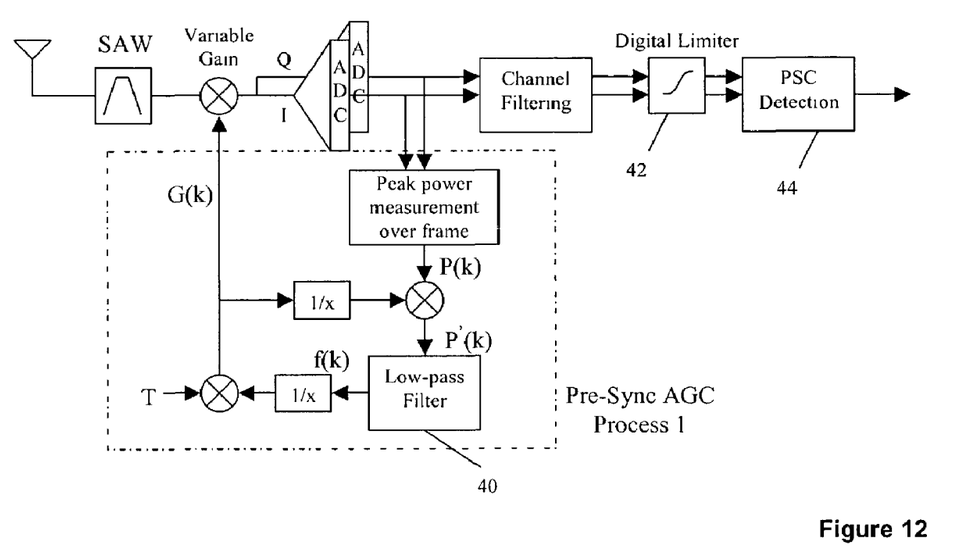
FIG. 12 shows a first mobile station AGC process (Process 1)

In FIG. 12, G(k) is the AGC gain applied to the receiver over the notional—or assumed—frame k (the frame is 'notional' since we do not know the absolute frame-start position at this stage). G(k) is derived by the pre-sync AGC process as described by the following steps:

Step 1

Find P(k), the peak power of the (complex) baseband signal measured at the output of the ADC's and before RRC (channel) digital filtering over frame k. For in-phase and quadrature ADC output samples with index m in frame k being represented by $I_k(m)$ and $Q_k(m)$ respectively, P(k) is simply:

$$P(k) = \max_m \{I_k^2(m) + Q_k^2(m)\}$$

Step 2

Calculate P'(k) the corresponding received peak power across frame k before the AGC gain, by dividing P(k) by the AGC gain applied in that frame {G(k)}. The division becomes a subtraction if a logarithmic power scale is used.

$$P'(k) = \frac{P(k)}{G(k)}$$

The first time the loop is called an initial gain setting G(k) must be assumed. This should be set to midway between maximum gain and minimum gain.

Step 3

Apply a linear-power version of P'(k) to an averaging (low-pass) filter 40. The filter 40 is of the form:

$$f(k) = A \times f(k-1) + B \times P'(k)$$

where f(k) is the filter output for the $k^{th}$ frame and A and B are filter coefficients:

$$A = 0.9 \; B = 0.1$$

Step 4

Adjust the desired linear AGC gain for the next frame $\{G_{lin}(k+1)\}$ such that:

If (either I or Q ADC's reached +'ve or −'ve full-scale output)

$$G_{lin}(k+1) = \max\left(\frac{G(k)}{\Delta_{clip}}, G_{min}\right)$$

Else $$G_{lin}(k+1) = \max\left(\frac{T_1}{f(k)}, G_{min}\right)$$

End $\Delta_{clip}$ is a divisor used to try to reduce the AGC gain in the event that either of the ADC's clipped. $\Delta_{clip}$ should default to a value of 2. $T_1$ is a linear target peak power setting derived such that the peak signal input to the ADC's sufficiently spans the ADC input range. Nominally $T_1$ shall be set to:

$$T_1 = 2\left(\frac{2^{B-1}}{2}\right)^2 = (2^{2B-3})$$

where B is the number of bits of each ADC $G_{min}$ is a minimum allowable AGC gain. It is set such that a signal with power equal to thermal noise at the receiver antenna will arrive at the ADC's with sufficient power to toggle at least 4 bits of the ADC (+/−8 levels).

$G_{min}$ is employed to prevent a signal at receiver sensitivity in timeslot 0 from being rendered undetectable in the event that the frame-AGC setting is determined by a very large-power co-channel timeslot (e.g., an UL transmission from a nearby mobile station).

In this case it is preferable to set the AGC for the whole frame such that timeslot 0 is detectable at the expense of clipping the high power timeslot at the ADC's (however, since the other timeslot is not of interest to the PSC detection, this is not a problem). It is possible for $G_{min}$ to cause timeslot 0 in the wanted channel to clip if the received power of the PCCPCH is large (i.e., low pathloss between mobile station and Node-B). However, the PSC detection process has been shown to provide only slightly degraded (but still acceptable) performance even under these non-linear and phase-distorting conditions.

It will be appreciated that, although in the AGC Process 1 example described above a power characteristic of peak power is used, other power characteristics such as mean power may alternatively be used.

Amplitude Equaliser

An amplitude equaliser (digital limiter) 42 is employed before the digital channel selection filter output is fed into the PSC detection process 44 (the PSC detection process 44 forms an initial synchronisation acquisition process). This is done in order to force the power of all received timeslots to be equal in an attempt to prevent false detection of the PSC peak in a timeslot with higher power than timeslot 0. It is preferable for the amplitude equaliser to retain phase information by jointly considering in-phase and quadrate samples before forming an amplitude-adjusted output. If I and Q samples are independently adjusted then the performance of the PSC detection process is degraded by approximately 1 dB. For a complex input x=I+jQ, the ideal amplitude equaliser is of the form:

$$y=k(I+jQ)$$

where $$k = \frac{A}{|I + jQ|},$$

A being the desired amplitude of the output sample.

Other approximate methods to adjust the amplitude of a complex signal are:

$$k = \frac{A}{\sqrt{2} \max\{|I|, |Q|\}}$$

$$k = A \times 2^{-\lceil \log_2(\max\{|I|,|Q|\}) \rceil}$$

which can be made to be easier to implement in hardware using compares, shifts and/or small lookup tables. These two methods result in some residual amplitude distortion, but preserve the phase the signal. The simplest non-phase-preserving amplitude equaliser is simply:

$$y=A \times (\text{sign}(I)+\text{sign}(Q))$$

Mobile Station Pre-Sync AGC Process 2

Figure 13:
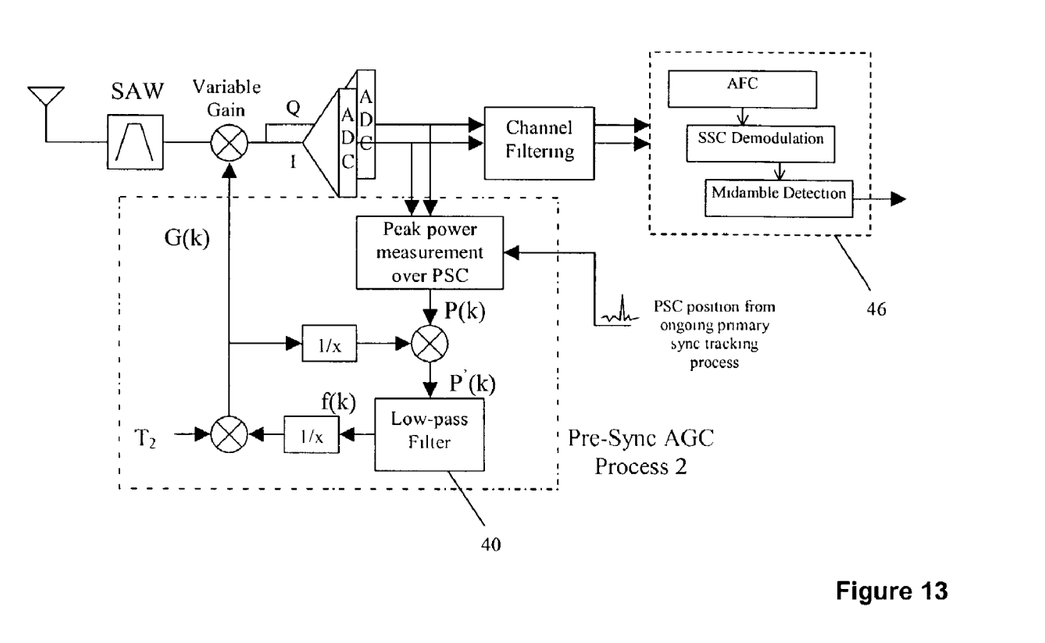
FIG. 13 shows a second mobile station AGC process (Process 2)

Once the position of the PSC has been identified, the AGC process is slightly modified in order to track the received power in the portion of the frame corresponding to the identified location of the PSC. This allows the AGC process to 'ignore' the power received in other timeslots such that the receiver gain can be adjusted to accommodate the wanted portion of the signal in timeslot 0. This allows an intermediate synchronisation acquisition process 46 comprising AFC, SSC demodulation and midamble detection to be carried out using a linear receiver (i.e., the amplitude equaliser 42 may be removed).

AGC process 2, illustrated in FIG. 13, is very similar to AGC process 1 with the following differences:

The input to the AGC loop is not the peak power over the whole frame, but instead is the peak power over only the PSC portion of the frame.

The minimum AGC gain setting $G_{min}$ restriction has been removed.

Step 1

Find P(k), the peak power of the (complex) baseband signal measured at the output of the ADC's and before RRC (channel) digital filtering over the 67 μs (256 chips at 3.84 Mcps, or 512 chips at 7.68 Mcps) following the detected arrival time of the PSC sequence. With sample index $m_0$ representing the start of the PSC and $m_{255}$ representing the end point of the PSC, and for in-phase and quadrature ADC output samples in frame k being represented by $I_k(m)$ and $Q_k(m)$ respectively, P(k) is simply:

$$P(k) = \max_{m_0 \to m_{255}} \{I_k^2(m) + Q_k^2(m)\}$$

Step 2

Calculate P'(k) the corresponding received peak power across frame k before the AGC gain, by dividing P(k) by the AGC gain applied in that frame {G(k)}. The division becomes a subtraction if a logarithmic power scale is used.

$$P'(k) = \frac{P(k)}{G(k)}$$

Step 3

Apply a linear-power version of P'(k) to an averaging (low-pass) filter 40. The filter 40 is of the form:

$$f(k)=A \times f(k-1)+B \times P'(k)$$

where f(k) is the filter output for the $k^{th}$ frame and A and B are filter coefficients:

A=0.9 B=0.1

Step 4

Adjust the desired linear AGC gain for the next frame $\{G_{lin}(k+1)\}$ such that:

If (either I or Q ADC's reached +'ve or −'ve full-scale output)

$$G_{lin}(k + 1) = \frac{G(k)}{\Delta_{clip}}$$

Else $$G_{lin}(k + 1) = \frac{T_2}{f(k)}$$

End $\Delta_{clip}$ should default to a value of 2. $T_2$ is a linear target peak power setting derived such that the peak signal input to the ADC's sufficiently spans the ADC input range. Nominally $T_2$ shall be set the same as $T_1$.

$$T_2 = 2\left(\frac{2^{B-1}}{2}\right)^2 = (2^{2B-3})$$

where B is the number of bits of each ADC

It will be appreciated that, although in the AGC Process 2 example described above a power characteristic of peak power is used, (as with the AGC Process 1) other power characteristics such as mean power may alternatively be used.

Mobile Station AGC Process 3

AGC process 3 is run in the mobile station once the start of timeslot 0 has been established (after SSC demodulation) and the midamble codes of the PCCPCH and SCCPCH in timeslot 0 are known.

The received power in a downlink timeslot at the mobile station in the IP Wireless system is a function of several variables. These are:

1. Number of codes transmitted in home cell (1-M codes=0-12 dB if M=16)
2. Downlink power control of those codes
3. Pathloss between home cell transmitter and mobile station receiver
4. Pathloss between other cells transmitters and mobile station receiver
5. Interference power transmitted in other cells
6. Adjacent channel and co-channel blockers The proposed frame-based AGC process is based on measurements taken in timeslot 0 (the beacon timeslot). Timeslot 0 is used due its beacon function (giving some knowledge as to what was transmitted in the timeslot) and also to prevent the mobile station from having to power-on in timeslots in which it has no allocation solely for AGC purposes, since this would result in increased power consumption (the mobile station has to power-on for timeslot 0 in any case).

Figure 14:
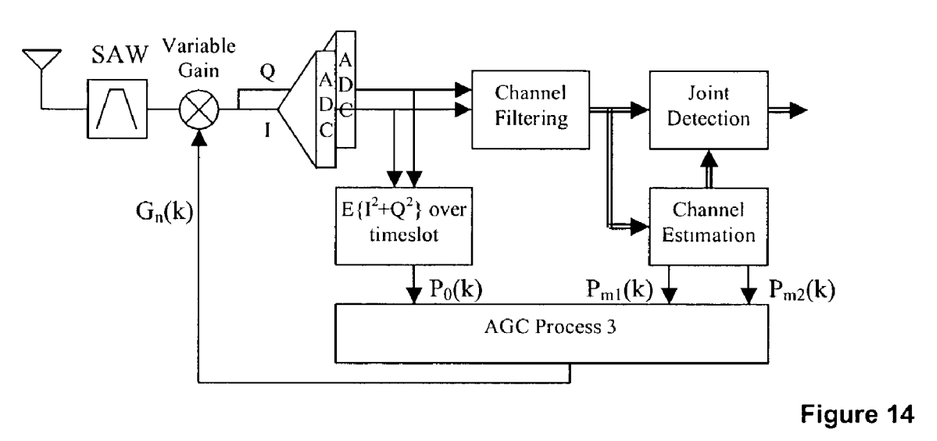
FIG. 14 shows mobile station post-synchronisation AGC.

An overview of AGC process 3 is given in FIG. 14.

In this diagram, $P_0(k)$ is the received mean power in timeslot 0 of frame k. $P_{m1}(k)$ is the received power of the primary midamble (the midamble associated with OVSF code 1 and PCCPCH) in timeslot 0 of the $k^{th}$ frame. $P_{m2}(k)$ is the received power of further non-beacon-associated midambles of the timeslot 0 of frame k. Both $P_{m1}(k)$ and $P_{m2}(k)$ power measurements are referenced to the ADC output (i.e., any effects of digital gains in the channel filtering and channel estimation blocks should be removed).

The goal of the loop is to keep the medium-term average of the quantity $z_0 = \{P_0(k) + 15(M-1)P_{m1}(k) - P_{m2}\}$ at a constant target level $T_3$, corresponding to 10 dB below the full-scale power of the ADC. The reasoning behind this is that in timeslot 0 we receive and measure a power out of the ADC's of $P_0(k)$. $P_0(k)$ can be thought of as being comprised of several terms:

1. Own-cell beacon (OVSF code 1) power ($P_{m1}$)
2. Own-cell FACH power ($P_{m2}$)
3. All other noise and interference comprising thermal noise, and in-band and out-of-band interference and blocking power. The total power is $I_0(k)$.

$P_0(k) = P_{m1}(k) + P_{m2}(k) + I_0(k)$

For the other downlink timeslots, if the interference power were to remain stationary, the maximum power we could receive would be:

$P_{0,max} = MP_{m1}(k) + I_0(k) = P_0(k) + (M-1)P_{m1}(k) - P_{m2}(k)$

Thus, by attempting to keep the quantity $z_0$ at a constant level, we are attempting to keep the maximum possible received DL power over the frame (based on measurements in timeslot 0) within the ADC dynamic range.

Figure 15:
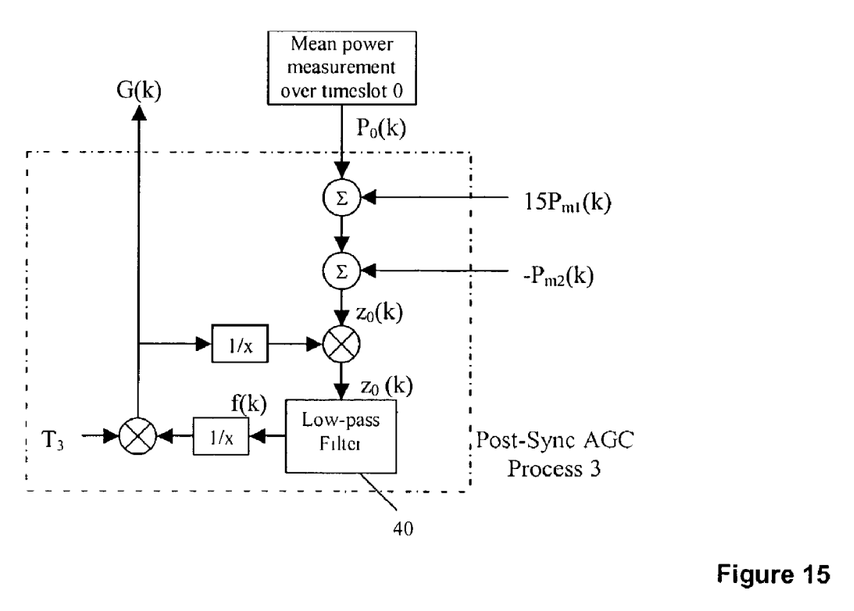
FIG. 15 shows a third mobile station AGC process (Process 3).

FIG. 15 shows the operation of AGC process 3.

Step 1

Measure $P_0(k)$, the average received power of the (complex) baseband signal across the timeslot 0 in frame k after the ADC and before RRC (channel) filtering.

$$P_0(k) = \frac{1}{N}\sum_{n=0}^{N-1}(I_n^2 + Q_n^2)$$

Step 2

Calculate $z_0$ as:

$z_0 = P_0(k) + (M-1)P_{m1}(k) - P_{m2}(k)$

Step 3

Calculate $z_0'(k)$ the corresponding value of $z_0(k)$ before the ADC gain in timeslot 0, G(k) was applied as:

$$z_0'(k) = \frac{z_0(k)}{G(k)}$$

Step 4

Apply $z_0'(k)$ to an averaging (low-pass) filter 40. The filter 40 may be of the form:

$f(k) = A \times f(k-1) + B \times z_0'(k)$ where f(k) is the filter output for the $k^{th}$ frame and A and B are filter coefficients:

A=0.9 B=0.1

Step 5

Adjust the desired linear AGC gain to be applied across the forthcoming frame k+1 {$G_{lin}(k+1)$} such that:

$$G_{lin}(k+1) = \frac{T_3}{f(k)}$$

where $T_3$ is a linear target power setting derived such that the signal input to the ADC's sufficiently spans the ADC input range.

The output is used for the final synchronisation acquisition process.

In the above embodiment each of AGC processes 1, 2 and 3 are employed, for the particular synchronisation stages mentioned. It is to be appreciated, however, that each of the AGC processes 1, 2 and 3 may individually be implemented as embodiments in their own right. Referring further to AGC process 1, in other embodiments the process may comprise use of a peak power of a received signal over a frame, as in the embodiment above, but alternative detailed implementation of this may take place rather than the detailed implementation described above. Likewise, referring further to AGC process 2, in other embodiments the process may comprise use of a peak power of a received signal over only a portion of a frame, the portion of a frame being a portion comprising an initial synchronisation code determined during a preceding initial stage of the synchronisation acquisition process, as in the embodiment above, but alternative detailed implementation of this may take place rather than the detailed implementation described above. Likewise, referring further to AGC process 3, in other embodiments the process may comprise use of measurements of a received signal taken in a downlink beacon timeslot, as in the embodiment above, but alternative detailed implementation of this may take place rather than the detailed implementation described above. Furthermore, in other embodiments any one or any combination of AGC processes 1, 2 and 3 may be employed at synchronisation acquisition stages or indeed for synchronisation processes other than those described above.

It will be understood that the AGC and synchronisation acquisition schemes and limiting architectures described above provides the following advantages:

1—The schemes described above are able to adjust the receiver gain of a mobile station such that it is able to position the amplitude of the received signal at the ADC input at an appropriate level even as the number of codes (and hence the power) transmitted is varied on a timeslot-by-timeslot basis.

2—The schemes described above, in addition to a limiting receiver architecture can be employed to enable robust initial synchronisation for TDD systems, even in the presence of strong mobile-to-mobile interference.

The invention claimed is:

1. A method of performing automatic gain control (AGC) in a communication system, comprising:
   measuring a total power ($P_t$) of signals received over a period of time;
   determining a non-beacon serving cell power ($P_{non-beacon}$);
   determining a beacon power ($P_{beacon}$);
   computing an expected maximum power of transmissions to be received ($P_m$) using the total power ($P_t$), the non-beacon serving cell power ($P_{non-beacon}$), and a multiplier (M) of the beacon power ($P_{beacon}$); and
   adjusting a receiver gain based at least on the computed $P_m$.

2. A method of claim 1, wherein computing the maximum expected power receipt ($P_m$) comprises computing:

$$P_t - P_{non-beacon} + (M-1) * P_{beacon}.$$

3. A method of claim 1, wherein the multiplier (M) of the beacon power ($P_{beacon}$) is indicative of a maximum expected power received from a transmitter of the communication system during a period of time.

4. For a wireless communication system having a transmission format including a beacon timeslot and non-beacon timeslots, a method of synchronization acquisition using an automatic gain control (AGC), the method comprising:
   clipping a high power signal received during at least one of the non-beacon timeslots without clipping a signal received in the beacon timeslot;
   detecting a synchronization code position in a signal received during the beacon time slot;
   setting a minimum allowable AGC gain ($G_{min}$) for application to received signals such that each received signal is sufficiently powerful to toggle at least a predetermined number of bits of an analog-to-digital converter (ADC) in spite of thermal noise in the receiver; and
   applying an AGC gain over a frame period comprising the beacon timeslot and the non-beacon timeslots, wherein the AGC gain is at least the $G_{min}$ value; and
   using the synchronization code position for identifying received data.

5. A method of claim 4, wherein the predetermined number of bits is at least 4 bits.

6. A method of claim 4, wherein a frame period comprises the beacon timeslot and the non-beacon timeslots, and clipping the high power signal comprises equalizing amplitudes and preserving phase information of received signals over the frame period.

7. A method of claim 4, wherein clipping the high power signal comprises applying an analogue limiter.

8. A method of claim 4, wherein clipping the high power signal comprises applying a digital limiter.

9. A computer readable medium storing program code for:
   measuring a total power ($P_t$) of signals received over a period of time;
   determining a non-beacon serving cell power ($P_{non-beacon}$);
   determining a beacon power ($P_{beacon}$);
   computing an expected maximum power of transmissions to be received ($P_m$) using the total power ($P_t$), the non-beacon serving cell power ($P_{non-beacon}$), and a multiplier of the beacon power ($P_{beacon}$); and
   adjusting a receiver gain based at least on the computed $P_m$.

10. The computer readable medium of claim 9, wherein computing the maximum expected power receipt ($P_m$) comprises computing $P_t - P_{nonbeacon} + (M-1) * P_{beacon}$.

11. The computer readable medium of claim 9, wherein the multiplier of the beacon power is indicative of a maximum expected power received from a transmitter of the communication system during a period of time.

12. A computer readable medium storing program code for synchronization acquisition in a wireless communication system having a transmission format including a beacon timeslot and non-beacon timeslots, the program code for:
   clipping a high power signal received during at least one of the non-beacon timeslots without clipping a signal received in the beacon timeslot;
   detecting a synchronization code position in a signal received during the beacon time slot;
   setting a minimum allowable AGC gain ($G_{min}$) for application to received signals such that each received signal is sufficiently powerful to toggle at least a predetermined number of bits of an analog-to-digital converter (ADC) in spite of thermal noise in the receiver; and
   applying an AGC gain over a frame period comprising the beacon timeslot and the non-beacon timeslots, wherein the AGC gain is at least the $G_{min}$ value; and
   using the synchronization code position for identifying received data.

13. The computer readable medium of claim 12, wherein the predetermined number of bits is at least 4 bits.

14. The computer readable medium of claim 12, wherein a frame period comprises the beacon timeslot and the non-beacon timeslots, and clipping the high power signal comprises equalizing amplitudes and preserving phase information of received signals over the frame period.

15. The computer readable medium of claim 12, wherein clipping the high power signal comprises applying an analogue limiter.

16. The computer readable medium of claim 12, wherein clipping the high power signal comprises applying a digital limiter.

* * * * *